(12) United States Patent
Patolsky et al.

(10) Patent No.: US 8,632,873 B2
(45) Date of Patent: Jan. 21, 2014

(54) ALIGNED NANOARRAY AND METHOD FOR FABRICATING THE SAME

(75) Inventors: Fernando Patolsky, Rechovot (IL); Tamir Ducobni, Tel-Aviv (IL); Alexander Pevzner, Kiryat-Ekron (IL); Yoni Engel, RaAnana (IL); Roey Elnathan, Jerusalem (IL); Moshit Ben-Ishai, Kfar-Saba (IL)

(73) Assignee: Ramot at Tel-Aviv University Ltd., Tel-Aviv (IL)

(*) Notice: Subject to any disclaimer, the term of this patent is extended or adjusted under 35 U.S.C. 154(b) by 0 days.

(21) Appl. No.: 13/390,719

(22) PCT Filed: Aug. 11, 2010

(86) PCT No.: PCT/IL2010/000649
§ 371 (c)(1),
(2), (4) Date: Feb. 16, 2012

(87) PCT Pub. No.: WO2011/021183
PCT Pub. Date: Feb. 24, 2011

(65) Prior Publication Data
US 2012/0148799 A1 Jun. 14, 2012

Related U.S. Application Data

(60) Provisional application No. 61/272,105, filed on Aug. 17, 2009.

(51) Int. Cl.
*D06N 7/04* (2006.01)
*B05D 1/12* (2006.01)
*B05C 11/00* (2006.01)

(52) U.S. Cl.
USPC ............................ 428/141; 427/180; 118/44

(58) Field of Classification Search
None
See application file for complete search history.

(56) References Cited

U.S. PATENT DOCUMENTS

| 7,064,372 B2* | 6/2006 | Duan et al. ............... 257/296 |
| 2006/0008942 A1 | 1/2006 | Romano et al. |
| 2008/0299031 A1 | 12/2008 | Liu et al. |
| 2011/0245074 A1* | 10/2011 | Smith et al. ............... 502/309 |

FOREIGN PATENT DOCUMENTS

| EP | 1612586 | 1/2006 |
| JP | 2006-228818 | 8/2006 |
| WO | WO 2007/145701 | 12/2007 |

OTHER PUBLICATIONS

Smith et al., Catalysts Communications 10 (2009) 1117-1121.*
Smith et al., J. Phys. Chem. C 2008, 112, 19635-19641.*
International Preliminary Report on Patentability Dated Mar. 1, 2012 From the International Bureau of WIPO Re. Application No. PCT/IL2010/000649.
International Search Report and the Written Opinion Dated Apr. 7, 2011 From the International Searching Authority Re. Application No. PCT/IL2010/000649.

* cited by examiner

*Primary Examiner* — Maria Veronica Ewald
*Assistant Examiner* — Nicole T Gugliotta (57) ABSTRACT

An elongated nanostructure is formed on a planar surface of a substrate such that the nanostructure is oriented generally perpendicularly to the surface. The nanostructure is then felled onto the surface such that it is oriented generally parallel to the surface.

26 Claims, 9 Drawing Sheets
(7 of 9 Drawing Sheet(s) Filed in Color)

ALIGNED NANOARRAY AND METHOD FOR FABRICATING THE SAME

RELATED APPLICATIONS

This application is a National Phase of PCT Patent Application No. PCT/IL2010/000649 having International filing date of Aug. 11, 2010, which claims the benefit of priority of U.S. Provisional Patent Application No. 61/272,105 filed on Aug. 17, 2009. The contents of the above applications are all incorporated herein by reference.

FIELD AND BACKGROUND OF THE INVENTION

The present invention, in some embodiments thereof, relates to nanofabrication and, more particularly, but not exclusively, to an aligned nanoarray and method for fabricating an aligned nanoarray.

As the market for low-cost and/or high-performance/density micron- and nano-scale electronic and electromechanical integrated circuits increases, many new assembly techniques investigated and commercialized. At the same time, there has also been a continued interest in scaling to nanometer dimensions the size of individual devices within such integrated circuits. In this respect, nanostructures, and in particular elongated nanostructures such as nanowires and nanotubes, have the potential to facilitate a whole new generation of electronic devices. The small dimensions of electrically-conducting nanowires such as carbon nanotubes make them useful as nano-scale, vertically-connecting wires between circuit device layers as well as in-plane connecting wires between adjacent electrical pads. A major impediment to the emergence of this new generation is the ability to effectively grow and harvest nanowires and other nanostructures that have consistent characteristics.

There is also an interest exists in developing large area macroelectronic devices. The large area of such devices is not used to fit all of the electronic components, but rather because such systems must be physically large to realize improved performance and the active components of such systems must be distributed over the large area to realize a useful functionality. The incorporation of active devices over a large common substrate is driven by system performance, reliability, and cost factors, not necessarily by individual component performance. Such large area macroelectronic devices could revolutionize a variety of technology areas, ranging from civilian to military applications. Example applications for such devices include driving circuitry for active matrix liquid crystal displays (LCDs) and other types of matrix displays, smart libraries, credit cards, radio-frequency identification (RFID) tags for smart price and inventory tags, security screening/surveillance or highway traffic monitoring systems, large area sensor arrays, and the like.

Large-scale assembly of nanowire and nanotube elements presents a significant challenge facing their integration in electronic applications. Several efforts have been focused on tackling the problem of controlled assembly.

In one technique forces generated by electric fields are used to direct different populations of biofunctionalized nanowires to specific regions of a chip while providing registry between each individual nanowire and photolithographic features within the respective region. This approach can be applied to nanowires carrying different DNA sequences whereby sequential injections of the nanowires are synchronized with spatially confined electric-field profile that directs nanowire assembly [Morrow et al., "Programmed Assembly of DNA-Coated Nanowire Devices," Science 323, 352-355 (2009)].

In another technique, nanochannel template guided methodology known as "grow-in-place" is employed. This methodology has been applied to single-wire four-point probe resistors and single-wire, top-gate SiNW unipolar accumulation metal oxide semiconductor field effect transistors [Shan, Y. and Fonash, S. J., "Self-Assembling Silicon Nanowires for Device Applications Using the Nanochannel-Guided 'Grow-in-Place' Approach," ACS Nano 2, 429-435 (2008)]. In the grow-in-place methodology, an empty nanochannels present in a template guides the SiNW vapor-liquid-solid (VLS) growth. Depending on the details of the nanochannel length and the growth process, the resulting SiNWs can extrude form, or be confined within the template. The fabricated nanowires are always fixed by the guiding channels and only the exact number of nanowires needed is fabricated.

In another technique blown film extrusion is employed for the formation of nanocomposite films where the density and orientation of the nanowires and nanotubes are controlled within the film. The technique involves preparation of a homogeneous polymer suspension of nanowires or nanotubes, expansion of the polymer suspension, and transferring of the bubble film to substrates. [Yu et al., "Large-area blown bubble films of aligned nanowires and carbon nanotubes," Nat. Nanotech. 2, 372 (2007)]

In another technique combines bottom-up nanowire assembly is combined with top-down microfabrication [Li et al., "Bottom-up assembly of large-area nanowire resonator arrays," Nat. Nanotech. 3, 88, (2008)].

Other techniques involves assembly of nanowires by molecular forces within a solution, by electrostatic interactions which rely on inherent polarizability or a surface modification, by shear forces applied to surface carrying the nanowire, by magnetic fields applied to magnetic nanowires suspended within a solution, and by dielectrophoresis (to this end see a review by Wang, M. C. P. and Gates, B. D., entitled "Directed assembly of nanowires" and published on 2009 in Mater. Today 12, 34-46).

SUMMARY OF THE INVENTION

According to an aspect of some embodiments of the present invention there is provided a method, which comprises forming on a planar surface of a substrate at least one elongated nanostructure oriented generally perpendicularly to the surface; and felling the nanostructure to orient the nanostructure generally parallel to the surface. In various exemplary embodiments of the invention the nanostructure is felled by applying a mechanical force on the nanostructure above a base thereof.

According to some embodiments of the invention there is a plurality of elongated nanostructures, wherein the felling is done such that at least 95% of the nanostructures are oriented generally parallel to the surface.

According to some embodiments of the invention the felling is done such that at least 95% of the nanostructures are generally parallel to each other.

According to some embodiments of the invention the felling is done at a non-liquid environment.

According to some embodiments of the invention the felling comprising rolling a roller device on the surface.

According to some embodiments of the invention the felling is done such that a drag distance of the nanostructure(s) is less than 1 micrometer away from a base of the nanostructure.

According to some embodiments of the invention the felling is done manually.

According to some embodiments of the invention the felling is done automatically.

According to an aspect of some embodiments of the present invention there is provided a system which comprises a substrate having a planar surface carrying thereon at least one elongated nanostructure oriented generally perpendicularly with respect to the surface; and a roller device designed and constructed to roll over the surface such as to fell the nanostructure and to orient the nanostructure generally parallel to the surface.

According to some embodiments of the invention the at least one elongated nanostructure comprises a plurality of elongated nanostructures.

According to some embodiments of the invention the roller-device has a surface which is characterized by roughness of less than 50 nm.

According to some embodiments of the invention the system further comprises a controller configured for controlling the roller device.

According to some embodiments of the invention a resistance to break of the nanostructure(s) is substantially lower at a base of the nanostructure(s) than at any other location over the nanostructure.

According to some embodiments of the invention a diameter of the nanostructure(s) is substantially lower at a base of the nanostructure(s) than at any other location over the nanostructure(s).

According to some embodiments of the invention the nanostructure comprises a nanowire. According to some embodiments of the invention the nanostructure comprises a nanotube.

According to an aspect of some embodiments of the present invention there is provided a system of nanostructures. The system comprises an array of at least 100 or at least 1,000 or at least 10,000 nanostructures aligned on a planar surface of a substrate generally parallel to the surface, wherein at least 95% of the nanostructures are generally parallel to each other.

According to some embodiments of the invention the nanostructures are located gridwise and periodically over the surface, and wherein each nanostructures is located at a distance of less than 500 nanometers from a site of the grid. According to some embodiments of the invention the grid is occupied to an occupation level of at least 95% by the nanostructures.

According to some embodiments of the invention the nanostructures the substrate is flexible.

According to an aspect of some embodiments of the present invention there is provided a circuit board. The circuit board comprises the system of nanostructures described herein.

According to an aspect of some embodiments of the present invention there is provided an identification tag. The identification tag comprises the system of nanostructures described herein.

According to an aspect of some embodiments of the present invention there is provided a memory medium. The memory medium comprises the system of nanostructures described herein.

According to an aspect of some embodiments of the present invention there is provided a smart card. The smart card comprises the system of nanostructures described herein.

According to an aspect of some embodiments of the present invention there is provided a projector display. The projector display comprises the system of nanostructures described herein.

According to an aspect of some embodiments of the present invention there is provided a method of fabricating a circuit board. The method comprises depositing a plurality of electronic components on the system of nanostructures described herein so as to establish electrical contacts between at least some of the nanostructures and at least some of the electrodes.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings and images. With specific reference now to the drawings and images in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

The present invention, in some embodiments thereof, relates to nanofabrication and, more particularly, but not exclusively, to an aligned nanoarray and method for fabricating an aligned nanoarray.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1:
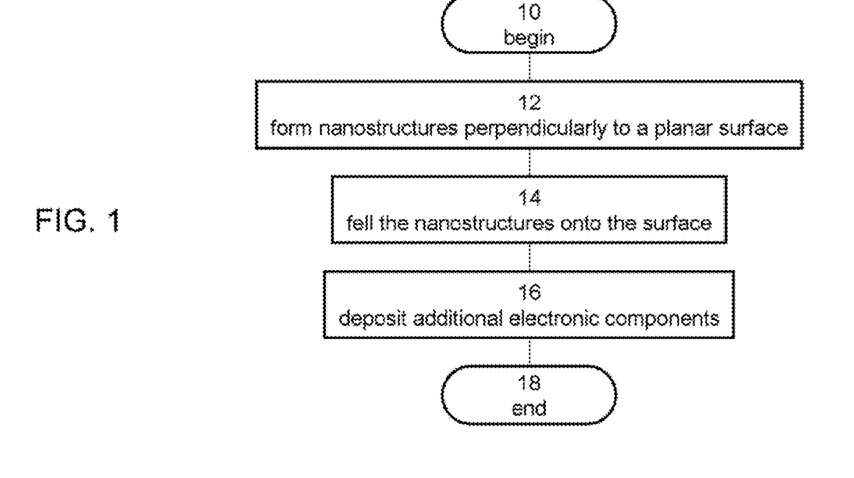
FIG. 1 is a flowchart diagram describing a method suitable for fabricating, e.g., a nanostructure, a nanostructure array or a circuitry, according to some embodiments of the present invention.

Referring now to the drawings, FIG. 1 is a flowchart diagram describing a method suitable for fabricating, e.g., a nanostructure, a nanostructure array or a circuitry according to various exemplary embodiments of the present invention.

The method begins at 10 and continuous to 12 at which one or more elongated nanostructure is formed on a planar surface of substrate.

The term "elongated nanostructure" generally refers to a three-dimensional body made of a solid substance, in which one of its dimensions is at least 2 times, or at least 10 times, or at least 50 times e.g., at least 100 times larger than any of the other two dimensions. The largest dimension of the elongated solid structure is referred to herein as the longitudinal dimension or the length of the nanostructure, and the other two dimensions are referred to herein as the transverse dimensions. The largest of the transverse dimensions is referred to herein as the diameter or width of the elongated nanostructure. The ratio between the length and the width of the nanostructure is known as the aspect ratio of the nanostructure.

In various exemplary embodiments of the invention the length of the elongated nanostructure is at least 100 nm, or at least 500 nm, or at least 1 µm, or at least 2 µm, or at least 3 µm, e.g., about 4 µm, or more.

The width of the elongated nanostructure is preferably less than 1 µm. In various exemplary embodiments of the invention the width of the nanostructure is from about 5 nm to about 200 nm, more preferably from about 5 nm to about 100 nm.

The elongated nanostructures are formed such that they are oriented generally perpendicularly with respect to the plane engaged by the surface.

The term "generally perpendicularly" refers to an angular relationship between a nanostructure and a plane or a planar surface. The nanostructure is said to be generally perpendicular to the plane if the angle between the nanostructure and the normal to the plane is, on the average, less than 20°, more preferably less than 10°, more preferably less than 5°, more preferably, but not obligatorily, less than 2°.

When the planar surface is oriented horizontally with respect to the ground, a nanostructure which is oriented generally perpendicularly with respect to the surface is referred to as a vertical nanostructure.

The elongated nanostructures of the present embodiments can be of any type known in the art, provided their diameter is in the sub-micron scale and that they are generally perpendicular with respect to the surface. The nanostructures can be nanowires, in which case they can have a solid elongated structure (namely non-hollow structure), or they can be nanotubes, in which case they can have an elongated hollow structure.

The nanostructures can also have a core-shell structure. This structure can be embodied in two ways.

In some embodiments, the structure which provides the core-shell nanostructure with its mechanical strength is the shell. In these embodiments the nanostructures are nanotubes with internal cavity that is filled with a filler material, such as, but not limited to, a conducting material, a semiconductor material, a thermoelectric material, a magnetic material (paramagnetic, ferromagnetic or diamagnetic), a light-emitting material, a biomineral, a polymer and/or an organic material. The filler material can be either in a condensed or in a gaseous state.

In some embodiments, the structure which provides the core-shell nanostructure with its mechanical strength is the core. In these embodiments the nanostructure are nanowires coated by a coating material which can also be conducting, semiconducting, thermoelectric, magnetic, light-emitting, biomineral, polymer and/or organic.

The nanostructures of the present embodiments can be made from a material selected from one or more of a semiconductor, a metal and a nonmetal. For example, semiconductor materials include, but are not limited to, an elemental semiconductor of Group IV and various combinations of two or more elements from any of Groups III, IV, V and VI of the periodic table of the elements.

As used herein, the term "group" is given its usual definition as understood by one of ordinary skill in the art. For instance, group III elements include B, Al, Ga, In and Tl; Group IV elements include C, Si, Ge, Sn and Pb; Group V elements include N, P, As, Sb and Bi; and Group VI elements include O, S, Se, Te and Po.

Also contemplated is any metal material including, but not limited to, aluminum (Al) and gallium (Ga), or any nonmetal material including, but not limited to, carbon (C), or combinations of metals and nonmetals, from the respective groups of elements from the periodic table. For example and not by way of limitation, silicon (Si), germanium (Ge), silicon carbide (SiC), gallium arsenide (GaAs), gallium indium arsenide (GaInAs) and zinc oxide (ZnO), are a few non-limitative examples of the materials that are useful as a nanostructure material according to some embodiments of the present invention.

The nanostructures of the present embodiments can also be fullerene carbon nanotubes, either single-walled nanotubes (SWNT), which are can be considered as long wrapped graphene sheets, or multi walled nanotubes (MWNT) which can be considered as a collection of concentric SWNTs with different diameters. A typical diameter of a SWNT is less of the order of a few nanometers and a typical diameter of a MWNT is of the order of a few tens to several hundreds of nanometers.

The nanostructures of the present embodiments can also be elongated heterostructures of nanometric size, e.g., nanowire heterostructures or nanotube hetero structures.

The term "heterostructure" as used herein refers to a structure in which materials having different compositions meet at interfaces. The different compositions forming a heterostructure can be different materials and/or different doping levels or types. An "elongated heterostructure of nanometric size" means a heterostructures having the dimensions of a nanostructure as defined above.

The different compositions can be distributed along the longitudinal direction of the elongated heterostructure, in which case the heterostructure is referred to as "axial heterostructure", or they can be distributed along the radial direction (e.g., forming a core with one or more shells), in which case the heterostructure is referred to as a "radial heterostructure." Both axial and radial heterostructures are contemplated in various embodiments of the invention.

An interface between two different compositions in a heterostructure can form a p-n junction, when the composition on one side of the interface includes a p-doping and the other the composition on the other side of the interface includes a n-doping. In embodiments in which the heterostructure includes more than one p-n junction along its longitudinal dimension, it essentially comprises segments along its lengths that are different. For example, a heterostructure can have alternating portions that are differently doped and/or are made from different materials. For example, an elongated heterostructure can include a first heavily p-doped silicon segment, a second heavily n-doped GaN segment, and a third heavily n-doped silicon segment. Any other combination of doping and materials in an elongated heterostructure can be used. The length of the doped segments of an elongated heterostructure may or may not be uniform.

The nanostructures of the present embodiments can also be organic nanostructures.

The phrase "organic nanostructure" refers to a nanostructure made at least in part of organic substance. As used herein, the phrase "organic substance" describes any substance that comprises carbon and hydrogen atoms, with or without additional elements.

One example of an organic nanostructure is a peptide nanostructure.

The term "peptide" as used herein encompasses native peptides (either degradation products, synthetically synthesized peptides or recombinant peptides) and peptidomimetics (typically, synthetically synthesized peptides), as well as peptoids and semipeptoids which are peptide analogs, which may have, for example, modifications rendering the peptides more stable while in a body.

Representative and non-limiting examples of peptide nanostructures suitable for the present embodiment are found in International Patent Publication No. WO2008/068752, the contents of which are hereby incorporated by reference.

The substrate on which the nanostructures are formed is selected in accordance with the type of nanostructures formed thereon and optionally in accordance with the application which is intended to employ the nanostructures. For example, when the nanostructures are semiconductor nanostructures, the substrate can be a silicon-on-insulator substrate or the like. a non limiting list of substrates suitable for the present embodiments include GaAs, InAs, Ge, SiGe, GaP, InP, CdSe.

The nanostructures of the present embodiments can be formed on the planar surface of the substrate by any process known in the art. Generally, these processes can be classified as constructive (also known as "bottom-up") processes, in which the nanostructures are grown perpendicularly to the surface of the substrate, and destructive (also known as "top-down") processes in which the nanostructures are sculptured from a bulk substrate by means of etching unwanted bulk material surrounding them.

Representative examples of techniques suitable for constructive processes, include, without limitation, VLS growth, solution phase growth, chemical vapor deposition (CVD), thermal chemical vapor deposition, vapor phase growth, self assembly, and the like. Representative examples of techniques suitable for destructive processes, include, without limitation, reactive-ion etching (RIE), deep RIE and the like.

In various exemplary embodiments of the invention the formation of nanostructures on the surface of the substrate includes a lithography (e.g., electron beam lithography, or nano-imprint lithography, photolithography, etc.) in which island are formed on the surface. When the nanostructures are formed by constructive process, each island serves as a catalyst for in-place growth of a single nanostructure thereon. When nanostructures are formed by constructive process, each island serves as a mask element for sculpting a single nanostructures therebelow.

The dimension, density, number and spatial distribution of the islands is selected as desired, but preferably in accordance with the application in which the nanostructures are intended to be employed. Typical dimension of an island is less than 1 μm, preferably from about 20 nm to about 500 nm. A typical distance between adjacent islands can vary from 100 nm or less to 10 μm or more. A typical number of islands is at least 10,000 or at least 100,000 or at least 1,000,000. Other numbers (including 1) are not excluded from the scope of the present invention. A typical distribution of the islands is a gridwise distribution, preferably over a periodic grid, such as, but not limited to, a rectangular grid.

The islands' material is selected in accordance with the technique used for the formation of the nanostructures. For example, gold or the like can be used for constructive process such as epitaxial growth, and aluminum, SU8 or the like can be used for destructive process, such as deep reactive-ion etching.

Once the islands are formed, the nanostructures can be formed (by constructive destructive process) as described above.

In various exemplary embodiments of the invention at least some of the nanostructures are formed such that their resistance to break is substantially lower at a base of the nanostructure than at any other location over the nanostructure. This can be achieved, for example, by making the diameter of the nanostructures substantially lower at the base than at any other location over the nanostructure. A representative example of a procedure suitable for forming such nanostructures is provided in the Examples section that follows. Reducing of the resistance to break at the base is particularly useful for nanostructures which are relatively short (e.g., below 1 μm in length) and thick (e.g., above 100 nm in diameter).

Once the nanostructures are on the surface, the method continues to 12 at which the nanostructures are felled onto the surface of the substrate so as to orient them generally parallel to the surface.

The term "generally parallel" refers to the angular relationship between a nanostructure and a plane or a planar surface, or between two elongated nanostructures. A nanostructure is said to be generally parallel to a plane if the angle between the nanostructure and the normal to the plane or planar surface is, on the average, from about 80° to about 90°, more preferably from about 85° to about 90°, more preferably, but not obligatorily, from about 88° to about 90°. When the planar surface is oriented horizontally with respect to the ground, a nanostructure which is oriented generally parallel to the surface is referred to as a horizontal nanostructure. A nanostructure is said to be generally parallel to another nanostructures if the angle between the two nanostructures is, on the average, less than 15°, or less than 10° or less than 5° or less than 2°.

In some embodiments of the present invention, 12 is executed while the planar surface is oriented horizontally with respect to the ground. In alternative embodiments of the present invention 12 is executed while the planar surface is oriented at an angle (e.g., about 5-30°) with respect to the ground. In these embodiments, the planar surface is preferably declined at the direction at which the nanostructures are felled.

When there is a plurality of perpendicular nano structures on the surface, the nanostructures are optionally felled such that at least 95% or at least 96% or at least 97% or at least 98% or at least 99% of the nanostructures are oriented generally parallel to the surface. Optionally and preferably, the nanostructures are felled such that at least 95% or at least 96% or at least 97% or at least 98% or at least 99% of the nanostructures are generally parallel to each other.

In various exemplary embodiments of the invention 12 is executed at a non-liquid environment. For example, in some embodiments, the nanostructures are felled at a gaseous environment. Alternatively, the nanostructures can be felled at vacuum conditions. In various exemplary embodiments of the invention 12 is executed at a so called "clean room" facility. It was found by the Inventors of the present invention that a clean room class 1000 or above is sufficient.

Figure 2A:
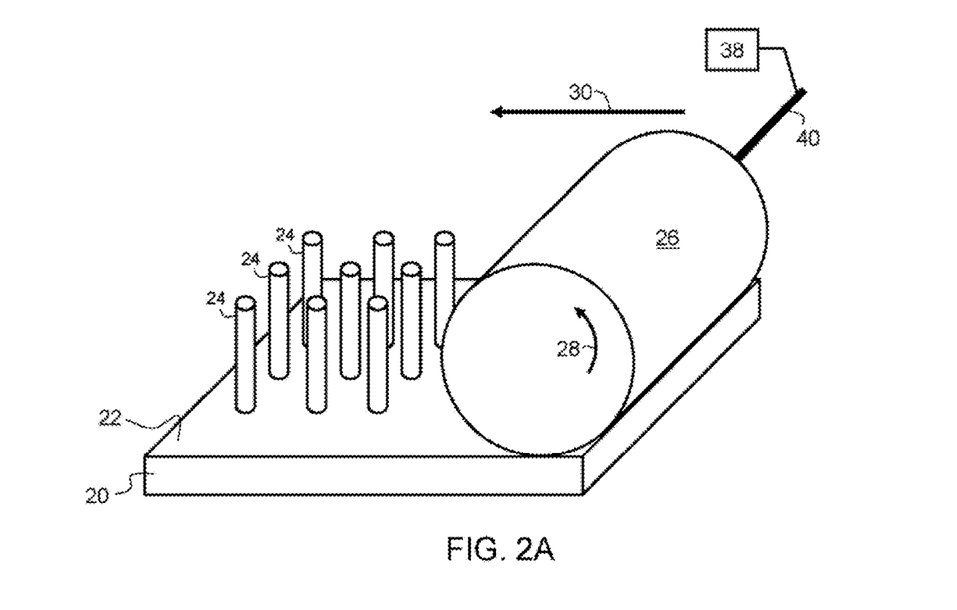
FIGS. 2A-B are schematic illustrations of perspective view (FIG. 2A) and a side view (FIG. 2B) of a device suitable for applying mechanical force on a nanostructure, according to some embodiments of the present invention.
Figure 2B:
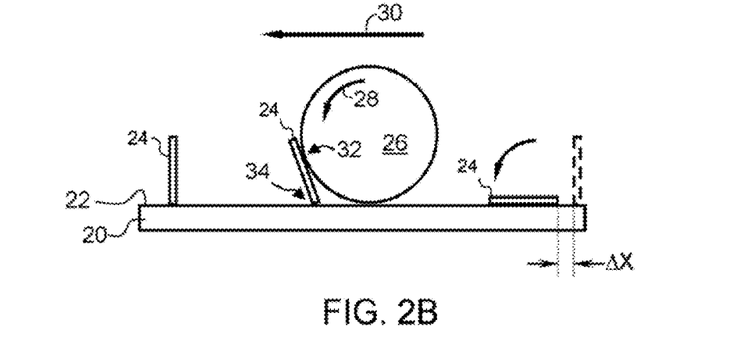

The method of the present embodiments preferably fells the nanostructures applying a force such as a mechanical force on the nanostructures above their base. FIGS. 2A-B are schematic illustrations of perspective view (FIG. 2A) and a side view (FIG. 2B) of a device suitable for applying such mechanical force, according to some embodiments of the present invention. Shown in FIG. 2 is a substrate 20 having a planar surface 22 and a plurality of nanostructures 24 generally perpendicular to surface 22. A roller device 26 is placed onto or slightly above surface 22. Rolling device is preferably cylindrical in its shape. Upon rotating and rolling of device 26 towards of nanostructures 24, the surface of device 26 contacts nanostructures 24 and applies a mechanical pressure thereto such that nanostructures 24 fell onto surface 22 and are oriented generally parallel to surface 22. The translation and rotational motions of device 26 are shown by arrows 28 and 30, respectively. The process of felling is illustrated in FIG. 2B. As shown the surface of device 26 contacts a point 32 above the base 34 of nanostructures 24, hence causes it to fell. In FIG. 2B, a dash line marks the original position and orientation of the felled nano structures.

The cylindrical surface of roller device 26 is preferably smooth. In some embodiments of the present invention the surface of device 26 which is characterized by roughness of less than 50 nm RMS, as conventionally determined by image analysis of atomic force microscopy using standard procedure. In some embodiments of the present invention the surface of device 26 is atomically smooth.

An "atomically smooth surface," as used herein refers to a surface having an RMS roughness which at most 0.5 nm, as determined by image analysis of atomic force microscopy using standard procedure.

The cylindrical surface of roller device 26 can be made from any material which is sufficiently rigid so as to prevent adhesion and impalement of the nanostructures to the surface of the roller. Optionally and preferably, surface of roller device 26 has a sufficient level of elasticity so as to prevent breaking of the nanostructures at random locations along their length other that base 34. In some embodiments of the present invention the surface of roller device is made of or coated by an elastomer, such as, but not limited to, polydimethylsiloxane (PDMS), polyisoprene, polybutadiene, polychloroprene, polyisobutylene, poly(styrene-butadiene-styrene), polyurethanes and silicones. In experiments performed by the present inventors adequate results have been achieved with a roller device coated by PDMS. Other materials for the surface of roller device 26 are not excluded from the scope of the present invention.

In various exemplary embodiments of the invention the nanostructures are felled such that a drag distance $\Delta X$ of the nanostructures is less than 1 μm, or less than 900 nm or less than 800 nm or less than 700 nm or less than 600 nm e.g., 500 nm or less.

Accurate felling (e.g., small or no drag distance and/or high level of parallelism between nanostructures) and a sufficiently high felling yield (e.g., high percentage of felled nanostructures) can be ensured by a judicious selection of the motion characteristics and magnitude of mechanical force applied by device 26. For example, it was found by the inventors of the present invention that a speed of 1 to 5 millimeters per seconds is sufficient for achieving small or no drag and high yield. High level of parallelism between nanostructures can be obtained when the nanostructures are arranged row-wise along straight rows whereby device 26 is rolled such that its axis of rotation is generally parallel to the rows. The mechanical force applied by device 26 generally depends on the mass and speed of device 26, and can therefore be controlled by varying the speed of motion. Further control can be achieved by applying pressure on device 26 during its motion.

Device 26 can be rolled manually or automatically, e.g., by means of a drive mechanism 40 and a controller 38 (not shown in FIG. 2B, see FIG. 2A). Manual rolling is preferred from the standpoint of simplicity. Automatic rolling is preferred from the standpoint of accurate control over the motion characteristics and applied force.

The method optionally continues to 16 at which additional electronic components, such as, but not limited to, electrodes, semiconductor elements and contact pads, are deposited on various locations over the surface. The additional electronic components can be of microscopic and/or millimeteric size as desired, and they are typically deposited such that at least some of the nanostructures contact one or more of these components. In some embodiments of the present invention there is at least one additional component which contacts more than one nanostructure.

When one or more of the nanostructures are elongated heterostructure, a single heterostructure can contact a plurality of additional components, depending on the number of segments in the heterostructure. The lengths of the segments of a particular heterostructure can be approximately equal to the distance between the two adjacent additional components which the heterostructure contacts. For example, elongated heterostructure can contact several electrodes whereby the lengths of the segments equals the distance between the electrodes, or slightly longer than the distance between the electrodes. In this manner, a single p-n junction of the heterostructure is located between two electrodes.

The additional components can be deposited in any techniques known in the art, including, without limitation, lithography (e.g., electron-beam lithography and photolithography), and techniques (e.g., nano imprint lithography).

The nanostructures and additional components form a circuitry which can be utilized in various applications, particularly, but not necessarily, in the field of large area electronics. In the circuitry, the nanostructures can serves as active components such as diodes and transistors and/or passive components interconnecting two or more active components.

The method ends at 18.

Figure 3:
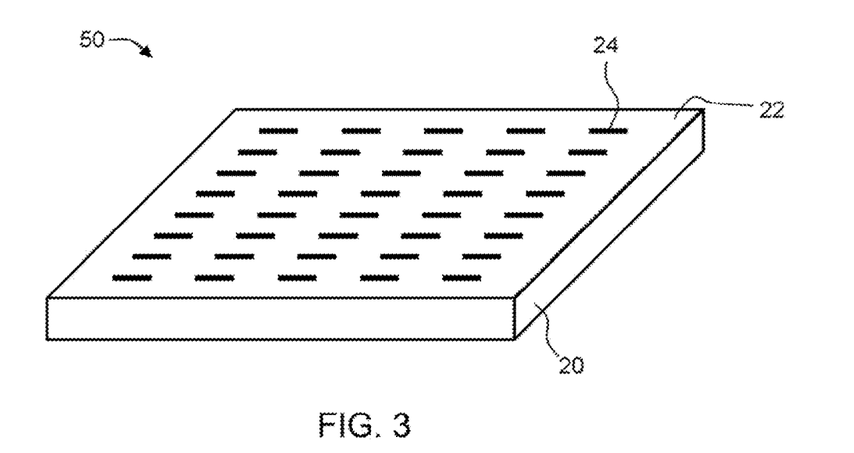
FIG. 3 is a schematic illustration of a system of nanostructures, according to some embodiments of the present invention.

FIG. 3 is a schematic illustration of a system 50 of nanostructures, according to various exemplary embodiments of the present invention. System 50 comprises an array of a plurality of elongated nanostructures, such as nanostructures 24 described above. Preferably, the number of nanostructures in system 50 is large (e.g., at least 10,000 nanostructures or at least 100,000 nanostructures or at least 1,000,000 nanostructures).

Nanostructures 24 are aligned on a planar surface of a substrate, such as surface 22 of substrate 20 described above. The substrate can be rigid or flexible, as desired. The total area occupied by the nanostructure array is preferably above 1 cm$^2$ or above 2 cm$^2$ or above 4 cm$^2$ or above 8 cm$^2$ or above 10 cm$^2$ or above 50 cm$^2$ or above 100 cm$^2$.

Preferably, the planar surface is substantially flat, namely it is devoid any grooves, wells, channels or outwardly protruding features. In various exemplary embodiments of the invention the planar surface is substantially smooth. In some embodiments the planar surface is characterized by roughness of less than nm 50 nm RMS, as conventionally determined by image analysis of atomic force microscopy using standard procedure. In some embodiments the planar surface is atomically smooth.

The nanostructures are aligned on the planar surface generally parallel to the surface. In various exemplary embodiments of the invention at least 95% or at least 96% or at least 97% or at least 98% or at least 99% of the nanostructures are generally parallel to each other. Preferably, the nanostructures are on the surface and not enclosed in wells formed within the substrate.

The nanostructures can be located gridwise on the planar surface. Thus, in this embodiment the nanostructures are addressable. The grid is a two-dimensional grid and it can be a periodic grid such as an orthogonal grid (e.g., a square grid and a rectangular grid), an isometric grid (e.g., a triangular grid) or another type of periodic grid such as hexagonal grid. In a preferred embodiment, the grid is an orthogonal grid. In various exemplary embodiments of the invention each an end point of elongated nanostructure is located at a distance of less than 1 μm or less than 900 nm or less than 800 nm or less than 700 nm or less than 600 nm or less than 500 nm or less from a site of the grid. In some embodiments, the grid is occupied by the nanostructures to an occupation level of at least 95% or at least 96% or at least 97% or at least 98% or at least 99%.

System 50 can be manufactured using the method described above with reference to FIGS. 1, 2A and 2B.

Figure 4:
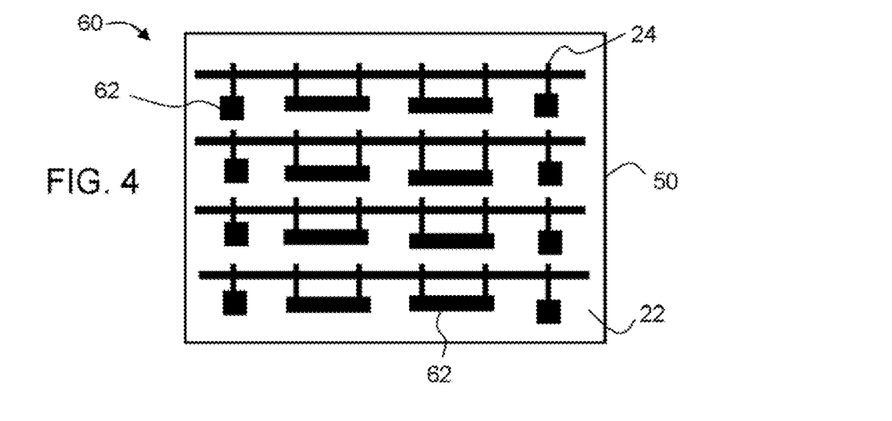
FIG. 4 which is a schematic illustration of circuit board, according to some embodiments of the present invention.

Reference is now made to FIG. 4 which is a schematic illustration of circuit board 60, according to various exemplary embodiments of the present invention. circuit board 60 comprises system 50 and a plurality of additional components 62, such as, but not limited to, electrodes, semiconductor elements and contact pads. The additional electronic components can be of microscopic and/or millimeteric size as desired, and they are typically deposited on the planar surface such that at least some of the nanostructures contact one or more of these components. In some embodiments of the present invention there is at least one additional component which contacts more than one nanostructure.

Circuit board 60 can be manufactured by depositing a plurality of additional electronic components on system 50.

Figure 5:
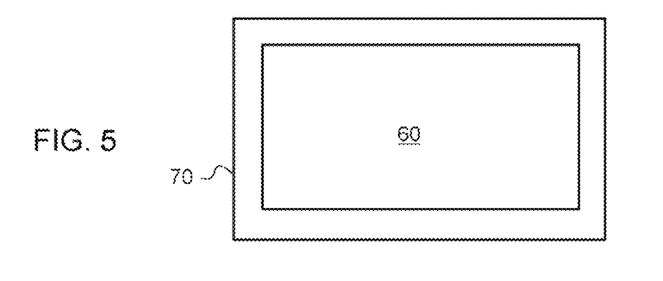
FIG. 5 is a schematic illustration of an appliance which includes the circuit board of FIG. 4, according to some embodiments of the present invention.

FIG. 5 is a schematic illustration of an appliance 70 which includes circuit board 60. Appliance 70 is typically, but not necessarily, a large area electronic appliance. Representative examples of appliances suitable for the present embodiments include, without limitation, a display device (e.g., an active matrix display device), a sensor (e.g., an electrochemical sensor), an identification tag, a memory medium, a smart card (e.g., a microprocessor card, cryptographic card, ATM card, subscriber identity module card also known as SIM card), and a projector display.

It is expected that during the life of a patent maturing from this application many relevant electronic appliances, particularly in the field of large area electronics will be developed and the scope of the term "appliance" is intended to include all such new technologies a priori.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Prototype nanostructure arrays and circuit boards have been manufactured according to the teachings of some embodiments of the present invention.

Materials and Methods

Figure 6A:
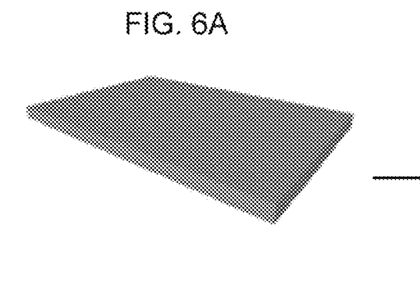
FIGS. 6A-D are schematic illustrations of a method employed according to some embodiments of the present invention for manufacturing prototype nanostructure arrays.
Figure 6B:
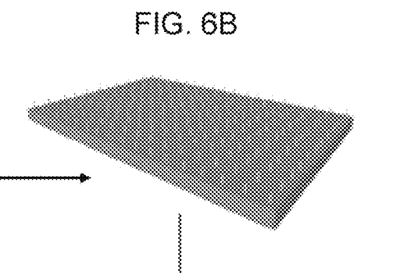
Figure 6C:
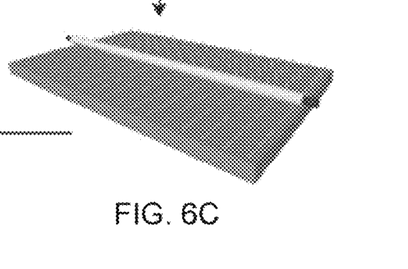
Figure 6D:
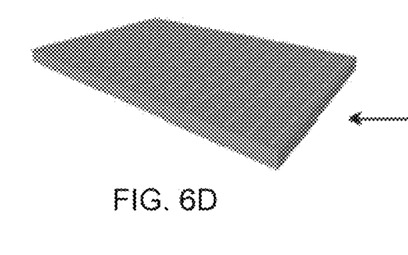

The procedure is depicted in FIGS. 6A-D. Metal nanoisland arrays were created on a planar surface (FIG. 6A). Subsequently, nanowire arrays were formed gridwise by a destructive or constructive technique at the locations of the array (FIG. 6B). The nanowires were then felled using a roller device (FIG. 6C) to form an array of nanowires (FIG. 6D) aligned generally parallel to the surface and generally parallel to each other, at approximately the locations of the islands. Additional electronic components, specifically source-drain electrodes and contacts were subsequently deposited on the array.

Fabrication of Nanoisland Arrays

Si wafers were cleaned by soaking in acetone, isopropyl alcohol (IPA) (each for a period of 5 minutes), rinsed with deionized water, soaked in $H_2SO_4$(97%)/$H_2O_2$(30%) ratio 3:1 for 5 minutes, thoroughly rinsed with deionized water and dried using a dry $N_2$ stream. The wafers were cleaned with oxygen plasma (100 W and 200 sccm $O_2$ for 300 s).

Cleaned Si wafers and silicon-on-insulator (SOI) wafers (4 µm p-type doped silicon device layer (about 1 Ω·cm resistivity)—500 nm $SiO_2$ (back gate dialectric layer)—350 µm highly doped n-type doped, 0.001 Ω·cm silicon handle wafer used as back-gate) coated with MMA resist (Copolymer resist EL9, MicroChem) by spinning at 5000 rpm for 60 s, followed by baking at 180° C. on a hotplate for 3 min.

PMMA resist (Polymer resist A4, MicroChem) was deposited on the MMA layer by spinning at 5000 rpm for 60 s, followed by baking at 180° C. on a hotplate for 1 min. For the formation of p/n diode arrays SOI wafers with a double device layer of 2 µm p-doped and 2 µm n-doped silicon layers were used.

A 50/100/200 nm dot array pattern was written by e-beam lithography or by the use of nanoimprint lithography molds. The photo-patterned wafer was developed by immersing in MIBK/IPA 1:3 for 1 minute, followed by rinsing with IPA for 10 s and drying using a dry $N_2$ stream.

Aluminum and gold array dot patterns was prepared by evaporation of and Al or Au metal layer of the required thickness using e-beam or thermal evaporation at a base pressure of the $10^{-7}$ Torr at 1 nm/s evaporation rate.

The remaining resist was lifted-off in Acetone/IPA 1:1 solution, washed with IPA for 5-10 s and dried using a dry $N_2$ stream.

Fabrication of Si Nanowires by Destructive Process

Arrays of Si nanowires aligned vertically with respect to the planar substrate were fabricated using the aluminum islands as highly-stable masks. The nanowires were fabricated by applying the so called "Bosch" time-multiplexed reactive ion etching (RIE) process (see, e.g., U.S. Pat. No. 5,501,893 to Laermer et al.) in an ICP DRIE PlasmaTherm SLR 770 machine.

In this process, alternated cycles of etching in a flow of $SF_6$ (12 sccm, 10 s) and passivation in a flow of $C_4F_8$ (60 sccm, 9 s) were used to etch the unprotected areas and to deposit fluorinated polymer to protect the side walls of the resulting etched structures. The plasma with these chemical species was generated with an RF power of 600 W and platen power of 14 W at a pressure of 8 mTorr. The temperature of the substrate was kept at 22° C. by cooling with a stream of helium. The samples were etched with different numbers of etch cycles, until the desired length was achieved or until reaching the silicon oxide layer for SOI wafers.

After the formation of the nanowire arrays aluminum and gold caps were chemically etched.

Figure 7A:
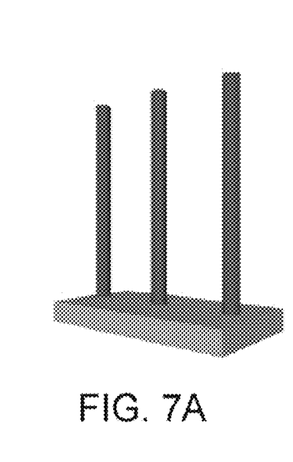
FIGS. 7A-D are schematic illustrations of a process for reducing resistance to brake at bases nanowires, according to some embodiments of the present invention.
Figure 7B:
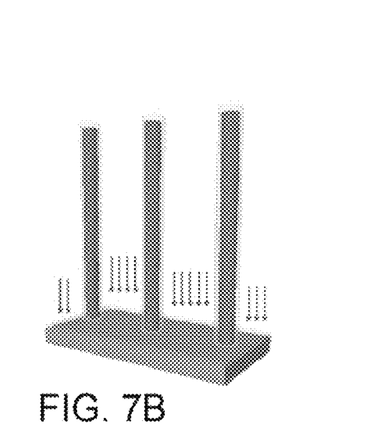
Figure 7C:
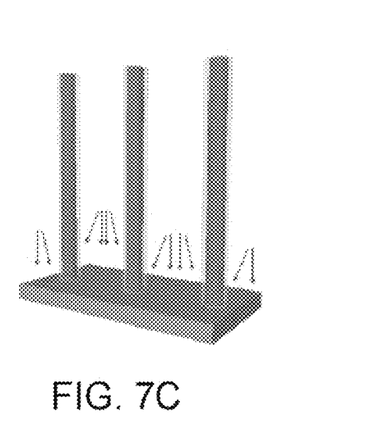
Figure 7D:
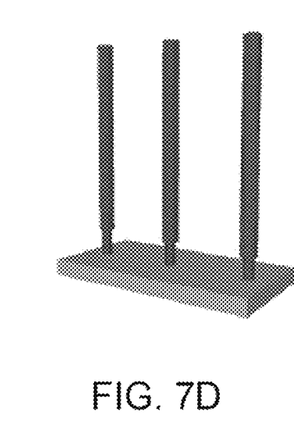

The resistance to brake at the basees of the thus formed silicon nanowires were reduced via an RIE process. The process is illustrated in FIGS. 7A-D. FIG. 7A illustrates the vertical nanowires at the beginning of the process. The nanowires were subjected to passivation of all exposed surfaces in a flow of $C_4F_8$. FIG. 7B illustrates the vertical nanowires after passivation. The passivation was followed by anisotropic directional etching performed in order to etch the passivation layer on all surfaces other than the nanowire walls. FIG. 7C illustrates the vertical nanowires after the anisotropic directional etching. An isotropic etching in $SF_6$ flow was performed in order to reduce the diameters of the nanowire bases. FIG. 7D illustrates the vertical nanowires after the isotropic etching. The bases of the nanowires have reduced diameter compared to all other parts.

Fabrication of Si and Germanium Nanowires by Constructive Process

Arrays of Silicon and germanium nanowires aligned vertically with respect to the planar substrate were grown by constructive process on the gold islands. The nanowires were prepared by the VLS approach with a home-made computer-controlled CVD set-up using $SiCl_4$/$H_2$ (820-920° C. growth temperature) or germane $GeH_4$/$H_2$ on silicon <111> wafers. ZnO vertical nanowires arrays were formed by a solution-based approach on ZnO seed-patterned silicon wafers.

Fabrication and Use of a Roller Device

A PDMS roller device was prepared using SYLGARD 184 Silicone Elastomer Kit (purchased from Dow Corning Inc.). The silicone elastomer was mixed thoroughly with curing agent (10:1) and degassed in a vacuum chamber (1-10 torr) for 30 minutes. The obtained mixture was transferred to a cylindrical mold and cured at a temperature of 100° C. for 10-360 minutes to form a cylindrical roller.

The roller device was rolled on the vertical nanowires manually at a speed of 1 to 5 millimeters per seconds.

Fabrication of a Roller Device

Following the felling of nanowires to horizontal orientation, Ni/Au source-drain electrodes and contacts were formed by a lithography approach. The substrates were dipped in a HF solution for 3 seconds to remove native oxide on nanowire surfaces, followed by the e-beam or thermal deposition of Ni/Au contacts. Next, an annealing step was carried out by rapid thermal annealing (RTA) to form a stable, conducting silicide with a low Schottky barrier. Transport characteristics were studied with the highly-doped silicon substrate serving as the back gate.

Results and Discussion

The present example demonstrate that arrays of nano structures aligned parallel to the surface can be fabricated by forming nanostructures aligned perpendicularly to the surface and felling them onto the surface by applying mechanical force.

Figure 8:
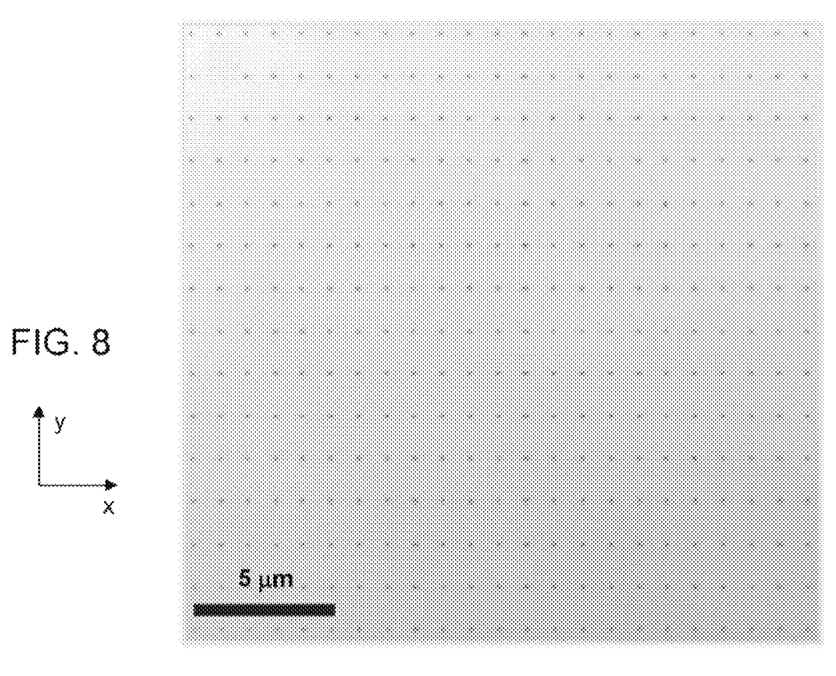
FIG. 8 is a confocal laser scanning microscope image of an array of aluminum islands, prepared according to some embodiments of the present invention.

FIG. 8 is a confocal laser scanning microscope image of an array of aluminum islands. The scale bar is 5 µm. The island is arranged over a rectangular grid. The distance between nearest neighbors sites are about 4 µm along the x direction and about 6 µm along the y direction. The size of a single island is 200 nm.

Figure 9:
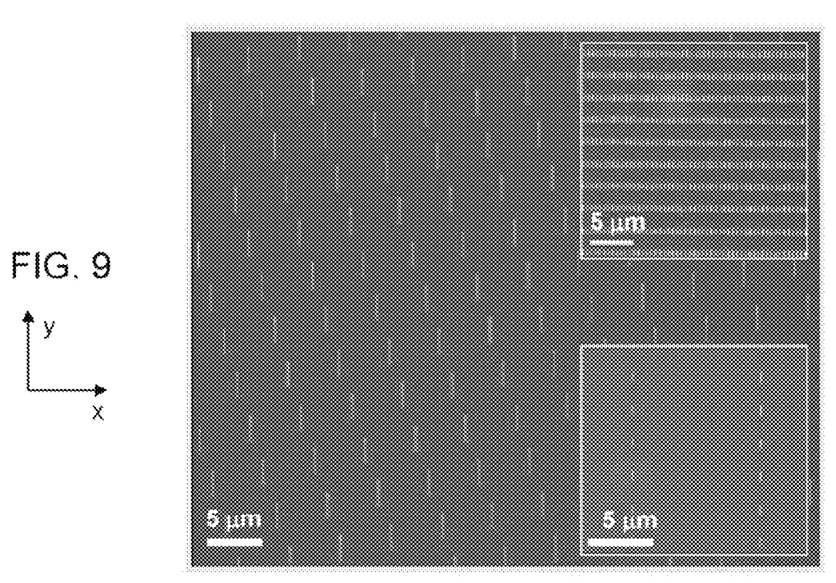
FIG. 9 shows an array of vertical silicon nanowire array prepared according to some embodiments of the present invention by destructive process on SOI wafer.

FIG. 9 is a SEM image showing an array of vertical silicon nanowire array prepared by destructive process on SOI wafer. The image was captured at tilt angle of 30°. The array included 100×10,000 nanowires, but only a portion of it is shown. The nanowires are about 80 nm in diameter and about 4 µm in length. The distance between adjacent nanowires (inter-wire distances) is about 4 µm along the x direction and about 6 µm along the y direction. The insets are high-magnification SEM images of vertical silicon nanowire arrays with inter-wire distances of 1 µm (top inset) and 20 µm (bottom inset). All scale bars correspond to 5 µm. Also prepared were arrays in which the inter-wire distances were 100 nm (data not shown).

As shown, large arrays of silicon nanowires of high morphological quality and perfectly-controlled length, diameter and density can be fabricated using the teachings of the present embodiments.

Figures 10A, 10B:
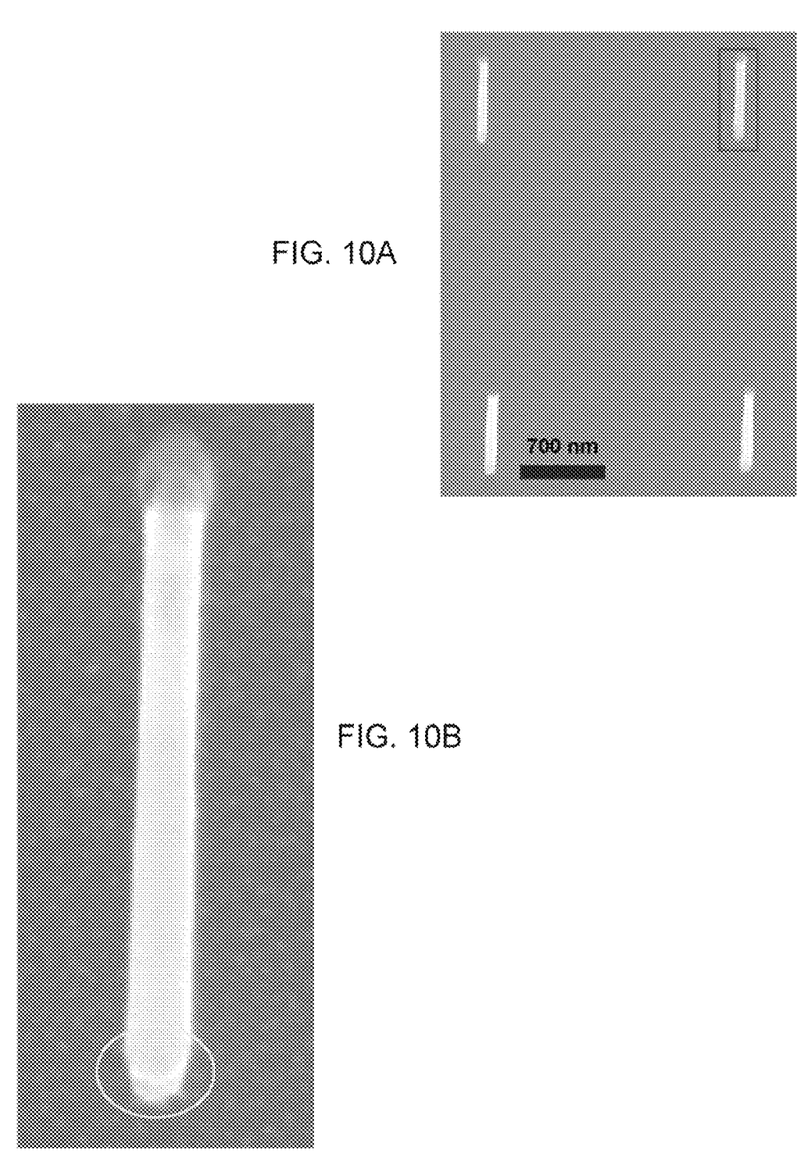
FIGS. 10A and 10B are SEM images showing reduced diameter bases of nanowires following a process performed according to some embodiments of the present invention.

FIGS. 10A and 10B are SEM images showing the reduced diameter at the base of nanowires following the process described above with reference to FIGS. 7A-D. FIG. 10B is a magnification of the top-right nanowire of FIG. 10A. The reduce diameter at the base of the nanowire also reduces its resistance to break and ensures that an applied mechanical force above the base will break the nanowire at the base.

Figure 11:
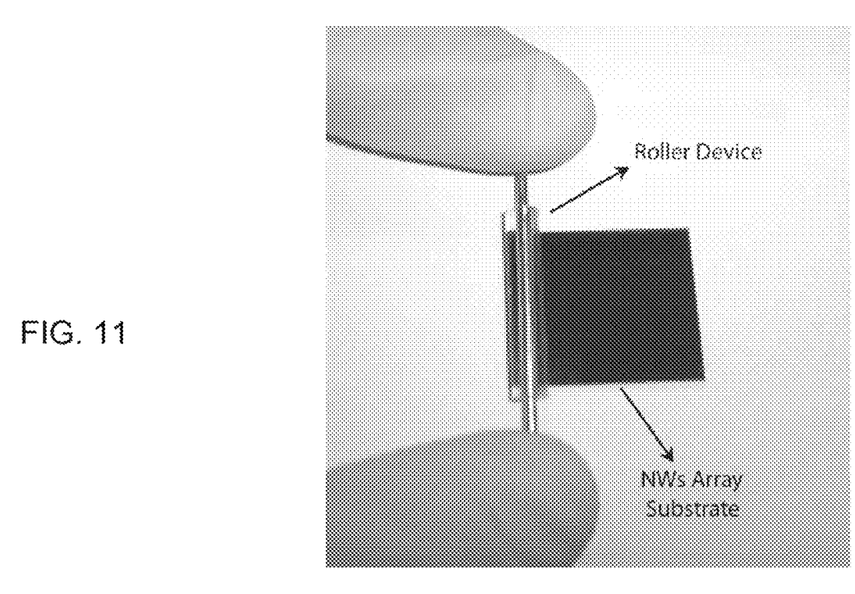
FIG. 11 is an image showing a manual process in which vertical nanostructures are felled onto a planar surface using a roller device according to some embodiments of the present invention.

FIG. 11 is an image showing the manual process of felling the nanostructures using the roller device onto the planar surface of the substrate. The size of the substrate is 10 cm².

Figure 12A:
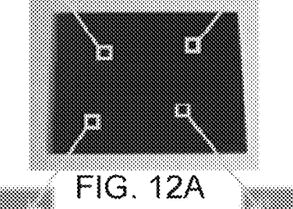
FIGS. 12A-E are images showing nanowires after the nanowires were felled onto the surface according to some embodiments of the present invention.
Figure 12B:
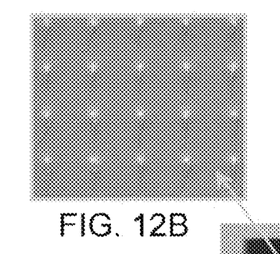
Figure 12C:
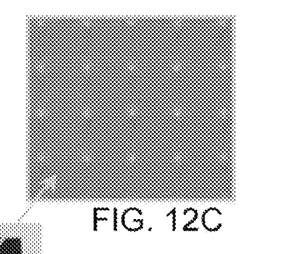
Figure 12D:
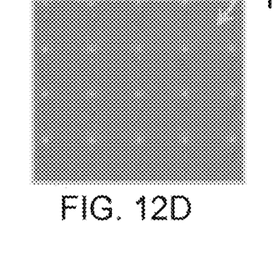
Figure 12E:
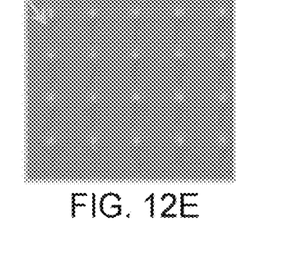

FIGS. 12A-E are images showing the nanowires after the nanowires were felled onto the surface by manual rolling. FIG. 12A is an image of a 4 cm² substrate, and FIGS. 12B-E are images taken at different location over the surface of the substrate demonstrating that efficiencies of the felling process are similar at different locations over the entire surface.

Figure 13:
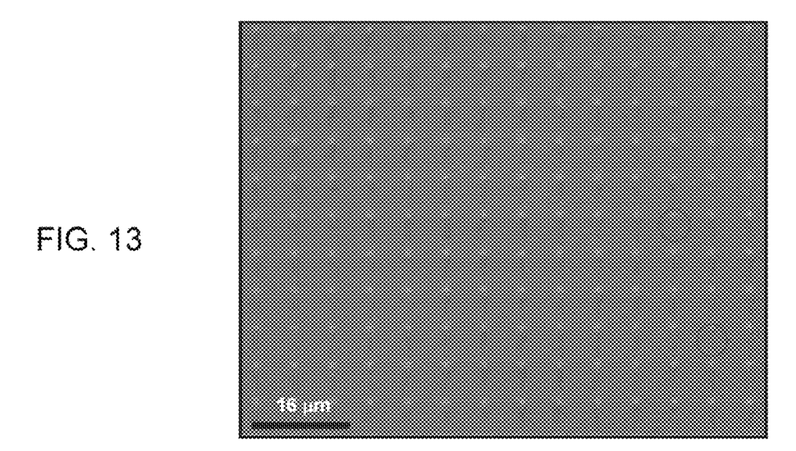
FIG. 13 is another image showing nanowires after the nanowires were felled onto the surface according to some embodiments of the present invention.

FIG. 13 is a SEM image showing a 15×11 nanowire array area after the nanowires were felled onto the surface by manual rolling. The scale bar is 16 µm. The circles represent sites which are considered "defective." A site was declared as defective if it is vacant or includes nanowires which are not parallel to other nanowires. It is noted that the deflection angles at all defective sites were of less that 10° with respect to the direction of rolling. The deflection angles may be attributed to small local deformations of the elastomer material due to inhomogeneities of the manually-applied pressure.

The manual rolling of the elastomer-based roller device over the nanowire array successfully aligned most of the nanowires (more than 98%) parallel to the surface. Most of the nanowires (more than 98%) were not dragged at all or dragged less than 200 nm away from their substrate-nanowire attachment sites. Approximately 1-2% of all sites were declared defective.

Figure 14A:
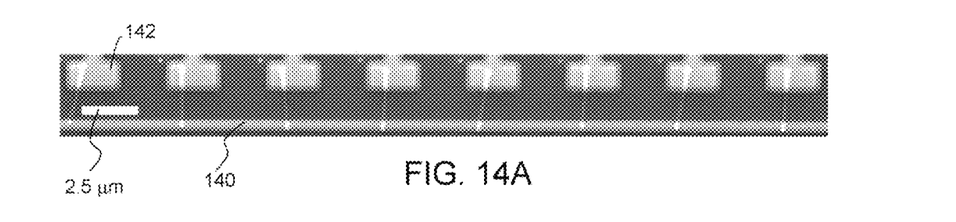
FIGS. 14A and 14B are SEM images of electric circuitries fabricated according to some embodiments of the present invention.
Figure 14B:
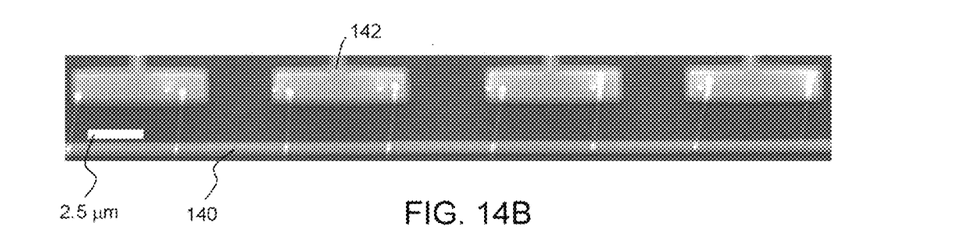

FIGS. 14A and 14B are SEM images of electric circuitries having rows of nanowire-based electrical devices. The circuitries were formed by depositing additional electric components on the nanowire array such as to establish contacts between the additional electric components and the nanowires. In the present example, the additional electric components included long Ni electrodes (designated 140) and Au contact pads (designated 142). Scale bar: 2.5 µm.

All nanowires in a row are in contact with electrode 140. FIG. 14A shows a circuitry in which each contact pad is in contact with a single nanowire, FIG. 14B shows a circuitry in which each contact pad is in contact with two nanowires. The long electrodes and contact pads form a source-drain and the nanowire serves as channels. The present example demonstrates that each of the nanowires in the array is addressable.

Figure 14C:
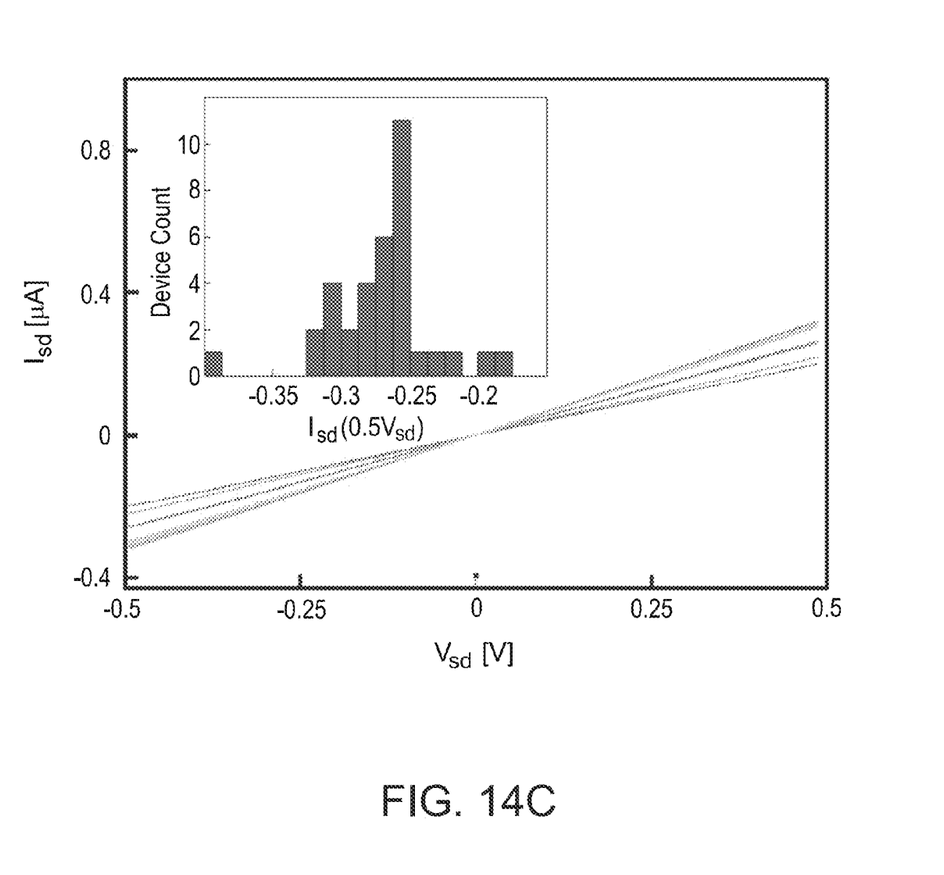
FIG. 14C is a graph showing a source-drain electrical current as a faction of the source-drain voltage for the circuitry of FIG. 14A.

FIG. 14C is a graph showing the source-drain electrical current as a faction of the source-drain voltage for the circuitry of FIG. 14A. The inset is a histogram demonstrating the low electrical-variability response obtained for a larger number of devices. FIG. 14C demonstrates similar performances for all devices.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method, comprising:
forming on a planar surface of a substrate at least one elongated nanostructure oriented generally perpendicularly with respect to said surface, wherein a diameter of said at least one nanostructure is substantially lower at a base of said nanostructure than at any other location over said nanostructure such that a resistance to break of said at least one nanostructure is substantially lower at said base than at said any other location; and
felling said nanostructure to orient said nanostructure generally parallel to said surface by applying a mechanical force on said nanostructure above a base thereof.

2. The method according to claim 1, wherein said at least one elongated nanostructure comprises a plurality of elongated nanostructures, and wherein said felling is done such that at least 95% of said nanostructures are at an average angle from about 80° to about 90° with respect to the normal to said surface.

3. The method according to claim 1, wherein said at least one elongated nanostructure comprises a plurality of elongated nanostructures, and wherein said felling is done such that at least 95% of said nanostructures are at less than 15° with respect to each other.

4. The method according to claim 1, wherein said felling is done at a non-liquid environment.

5. The method according to claim 1, wherein said felling comprising rolling a roller device on said surface.

6. The method according to claim 1, wherein said felling is by a roller device, and wherein motion characteristics and magnitude of mechanical force applied by said roller device are selected such that a drag distance ΔX of said at least one nanostructure is less than 1 micrometer away from a base of said nanostructure.

7. The method according to claim 1, wherein said felling is done by a manually-operated roller device.

8. The method according to claim 1, wherein said felling is done automatically.

9. A system, comprising:
   a substrate having a planar surface carrying thereon at least one elongated nanostructure oriented generally perpendicularly with respect to said surface, wherein a diameter of said at least one nanostructure is substantially lower at a base of said nanostructure than at any other location over said nanostructure such that a resistance to break of said at least one nanostructure is substantially lower at said base than at said any other location; and
   roller device designed and constructed to roll over said surface such as to fell said nanostructure and to orient said nanostructure generally parallel to said surface.

10. The system according to claim 9, wherein said at least one elongated nanostructure comprises a plurality of elongated nanostructures.

11. The system according to claim 9, wherein said roller-device has a surface which is characterized by roughness of less than 50 nm.

12. The system according to claim 9, further comprising a controller configured for controlling said roller device.

13. The method according to claim 1, wherein said at least one nanostructure comprises a nanostructure selected from the group consisting of a nanowire and a nanotube.

14. The method according to claim 1, wherein said at least one nanostructure comprises a nanotube.

15. A system of nanostructures, comprising an array of at least 10,000 nanostructures aligned on a planar surface of a substrate generally parallel to said surface,
   wherein at least 95% of said nanostructures are generally parallel to each other,
   wherein said nanostructures are located gridwise and periodically over said surface,
   wherein the system is obtained by forming on said surface, at a plurality of grid sites of said grid, a respective plurality of elongated nanostructures oriented generally perpendicularly to said surface, and felling said nanostructures to orient said nanostructures generally parallel to said surface and to each other by applying a mechanical force on said nanostructure above a base thereof, and
   wherein a diameter of said plurality of elongated nanostructures is substantially lower at a base of said nanostructure than at any other location over said nanostructure such that a resistance to break of said nanostructures is substantially lower at said base than at said any other location.

16. The system according to claim 15, wherein said grid is occupied to an occupation level of at least 95% by said nanostructures.

17. The system according to claim 15, wherein said substrate is flexible.

18. A circuit board, comprising the system according to claim 15.

19. A display device, comprising the circuit board of claim 18.

20. A sensor, comprising the circuit board of claim 18.

21. An identification tag, comprising the circuit board of claim 18.

22. A memory medium, comprising the circuit board of claim 18.

23. A smart card, comprising the circuit board of claim 18.

24. A projector display, comprising the circuit board of claim 18.

25. A method of fabricating a circuit board, comprising depositing a plurality of electronic components on a system of nanostructures so as to establish electrical contacts between at least some of said nanostructures and at least some of said electrodes,
   wherein the system of nanostructures comprises an array of at least 10,000 nanostructures aligned on a planar surface of a substrate generally parallel to said surface,
   wherein at least 95% of said nanostructures are generally parallel to each other,
   wherein said nanostructures are located gridwise and periodically over said surface,
   wherein the system is obtained by forming on said surface, at a plurality of grid sites of said grid, a respective plurality of elongated nanostructures oriented generally perpendicularly to said surface, and felling said nanostructures to orient said nanostructures generally parallel to said surface and to each other by applying a mechanical force on said nanostructure above a base thereof, and
   wherein a diameter of said plurality of elongated nanostructures is substantially lower at a base of said nanostructure than at any other location over said nanostructure such that a resistance to break of said nanostructures is substantially lower at said base than at said any other location.

26. The system according to claim 15, being obtainable by forming said nanostructures in situ.

* * * * *